United States Patent
Goto

[11] Patent Number: 6,079,622
[45] Date of Patent: Jun. 27, 2000

[54] NON-CONTACT INFORMATION STORAGE MEDIUM AND DATA TRANSMISSION METHOD FOR THE MEDIUM

[75] Inventor: Yuichi Goto, Hadano, Japan

[73] Assignee: Kabushiki Kaisha Toshiba, Kawasaki, Japan

[21] Appl. No.: 08/957,446

[22] Filed: Oct. 24, 1997

[30] Foreign Application Priority Data

Oct. 24, 1996 [JP] Japan .................................. 8-282513

[51] Int. Cl.[7] .................................................. G06K 19/06
[52] U.S. Cl. ...................... 235/492; 235/380; 340/825.54
[58] Field of Search .................................. 235/492, 380, 235/449, 487; 340/825.54, 825.34

[56] References Cited

U.S. PATENT DOCUMENTS

| | | | |
|---|---|---|---|
| 4,196,418 | 4/1980 | Kip et al. | 340/825.54 X |
| 4,814,595 | 3/1989 | Gilboa | 235/492 |
| 4,899,036 | 2/1990 | McCrindle et al. | 235/380 |
| 4,962,485 | 10/1990 | Kato et al. | 365/229 |
| 5,362,954 | 11/1994 | Komatsu | 235/492 |
| 5,378,887 | 1/1995 | Kobayashi | 235/492 |
| 5,610,684 | 3/1997 | Goto | 235/435 |
| 5,670,772 | 9/1997 | Goto | 235/492 X |
| 5,854,481 | 12/1998 | Ricotti et al. | 235/492 |
| 5,889,273 | 3/1999 | Goto | 235/492 |

FOREIGN PATENT DOCUMENTS

| | | |
|---|---|---|
| 525642A2 | 2/1993 | European Pat. Off. . |
| 602449A2 | 6/1994 | European Pat. Off. . |
| 3717109A1 | 12/1987 | Germany . |
| 96/38805 | 12/1996 | WIPO . |

*Primary Examiner*—Michael G Lee
*Attorney, Agent, or Firm*—Pillsbury Madison & Sutro LLP Intellectual Property Group

[57] ABSTRACT

A non-contact information storage medium for receiving power from a card reader/writer via an antenna, using the power for driving its internal circuit, and simultaneously transmitting data as a transmission wave to the outside thereof. The output current of a rectifier circuit is interrupted by a switching circuit incorporated in a modulation circuit in accordance with the transmission wave. In the period of interruption, the output voltage of the rectifier circuit is limited by a voltage limiting circuit incorporated in the modulation circuit to a value not more than the breakdown voltage of elements which constitute the circuit. The loss of power during data transmission is extremely small, and hence the circuit can be constituted by elements of a usual breakdown voltage.

10 Claims, 5 Drawing Sheets

FIG. 3A TRANSMISSION WAVE (a)
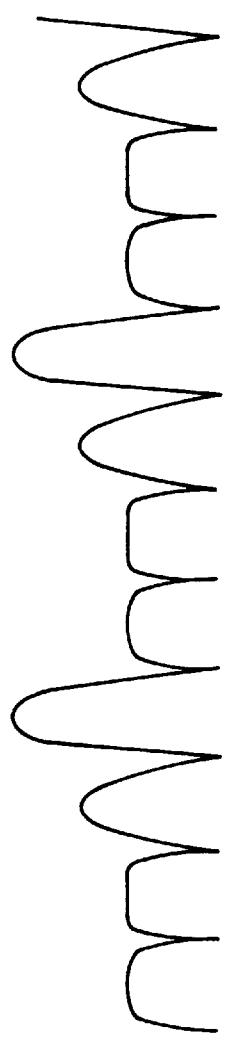
FIG. 3B RECTIFIER OUTPUT (b)
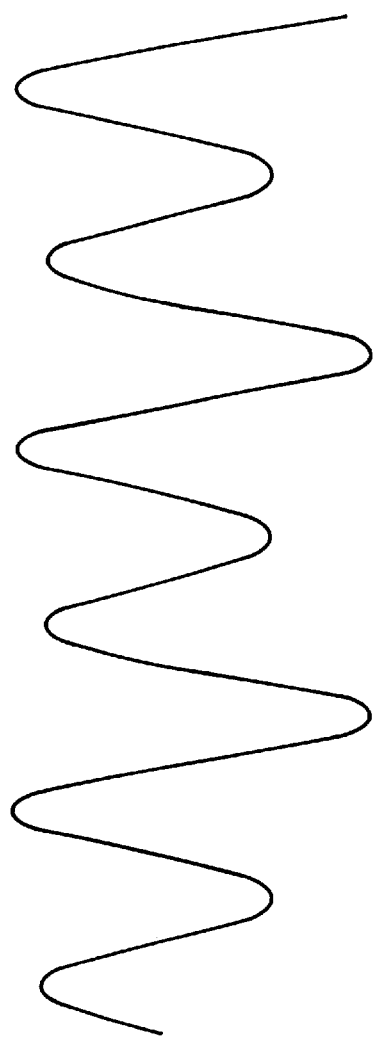
FIG. 3C ANTENNA COIL CURRENT (c)

NON-CONTACT INFORMATION STORAGE MEDIUM AND DATA TRANSMISSION METHOD FOR THE MEDIUM

BACKGROUND OF THE INVENTION

This invention relates to a non-contact information storage medium and a data transmission method for the medium, and more particularly to a medium of this type, such as a non-battery type radio card or a radio tag, and a data transmission method for the medium, used to perform communication with a data processing unit such as a card reader/writer (herein-after simply called a "reader/writer").

In the field of information processing systems, an information processing system has recently been developed, which includes a non-contact information storage medium (such as a non-battery type radio card or a radio tag) used as, for example, an entrance/leaving management system, and an information processing unit (such as a reader/writer) for performing non-contact radio communication with the non-contact information storage medium.

The non-contact information storage medium, i.e. the non-battery type radio card or the radio tag, receives a radio wave generated through the transmission antenna of the information processing unit, i.e. the reader/writer, and simultaneously subjects a signal indicative of data stored therein to slight amplitude modulation, thereby transmitting the modulated signal to the reader/writer in the form of a transmission wave.

The reader/writer receives the transmission wave from the non-battery type radio card or the radio tag, using a signal reception antenna.

More specifically, the non-contact information storage medium generally obtains power for driving its internal circuit by rectifying and smoothing a radio wave (i.e. an electromagnetic wave) from the reader/writer, using an antenna incorporated in the medium, and simultaneously transmits data stored therein, using the same antenna. To this end, the medium employs a data transmission method, such as a method for increasing a load current obtained through the antenna, or a method for changing its antenna-resonating electrostatic capacitance.

However, in the case of using, as the data transmission method, the method for increasing the load current obtained through the antenna, a great amount of load current will be lost. On the other hand, in the case of using the method for changing the antenna-resonating electrostatic capacitance, the resonance frequency of the antenna will inevitably vary. As a result, the amount of power which can be used within the non-contact information storage medium may well decrease, or the distance over which data can be transmitted may decrease. Thus, neither method is suitable for efficient data transmission between the non-contact information storage medium and the reader/writer.

BRIEF SUMMARY OF THE INVENTION

It is the object of the invention to provide a non-contact information storage medium capable of efficiently using power obtained via an antenna incorporated therein, keeping the resonance frequency of the antenna constant, preventing loss of power used within the medium, thereby securing a sufficient distance over which data can be transmitted, and a data transmission method used in the non-contact information storage medium.

According to an aspect of the invention, there is provided a non-contact information storage medium for receiving power from a radio wave applied to the medium from the outside, and transmitting data in the form of a transmission wave to the outside, comprising: at least one antenna for obtaining the power from the radio wave applied thereto from the outside of the medium; a rectifier circuit for converting the power obtained by the antenna into an output current as power for a circuit incorporated in the medium; and a modulation circuit for modulating the current of the rectifier circuit by interrupting the current in accordance with the transmission wave. Data is transmitted to a reader/writer as a result of the modulation processing by the modulation circuit.

When the output current of the rectifier circuit, i.e. a rectifier circuit, is interrupted, it is possible that its output voltage will exceed the breakdown voltage of each circuit element. To avoid this, the modulation circuit includes a voltage limiting circuit for limiting the output voltage of the rectifier circuit to a value less than a predetermined value.

The information storage medium of the invention further comprises a smoothing capacitor for accumulating the output current of the rectifier circuit and smoothing an output voltage thereof, and the modulation circuit includes a switching circuit for switching on and off a current path from the rectifier circuit to the smoothing capacitor in accordance with the transmission wave. The switching circuit is constituted of a p-channel MOS transistor which has its gate adapted to receive the transmission wave.

The modulation circuit of the information storage medium includes a voltage limiting circuit for limiting the output voltage of the rectifier circuit to a value less than a predetermined value when the output current of the rectifier circuit is interrupted.

The information storage medium of the invention further comprises: a smoothing capacitor for accumulating the output current of the rectifier circuit and smoothing an output voltage thereof, and wherein the modulation circuit includes a switching circuit constituted by a MOS transistor for switching on and off a current path from the rectifier circuit to the smoothing capacitor in accordance with the transmission wave, and the voltage limiting circuit includes a control voltage generating circuit for generating a control voltage corresponding to the predetermined value, and a voltage control circuit for controlling the output voltage of the rectifier circuit by supplying the control voltage to a gate of the MOS transistor.

The switching circuit includes a p-channel MOS transistor having a source connected to an output of the rectifier circuit, a drain connected to the smoothing capacitor, and a gate, and the voltage control circuit controls the output voltage of the rectifier circuit by supplying the control voltage to the gate of the p-channel MOS transistor.

According to another aspect of the invention, there is provided a data transmission method applicable to a non-contact information storage medium which transmits data in the form of a transmission wave while obtaining power from a radio wave generated from the outside of the medium, comprising the steps of: obtaining the power from the radio wave generated from the outside of the medium, using at least one antenna; supplying the power, obtained via the at least one antenna, to an internal circuit in the medium via a rectifier circuit; and modulating the power, supplied via the rectifier circuit, by interrupting the power in accordance with the transmission wave, thereby transmitting the data.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A–3C are views, showing waveforms generated from the essential part of the first embodiment while it operates;

DETAILED DESCRIPTION OF THE INVENTION

The embodiments of the invention will be described with reference to the accompanying drawings.

Figure 1:
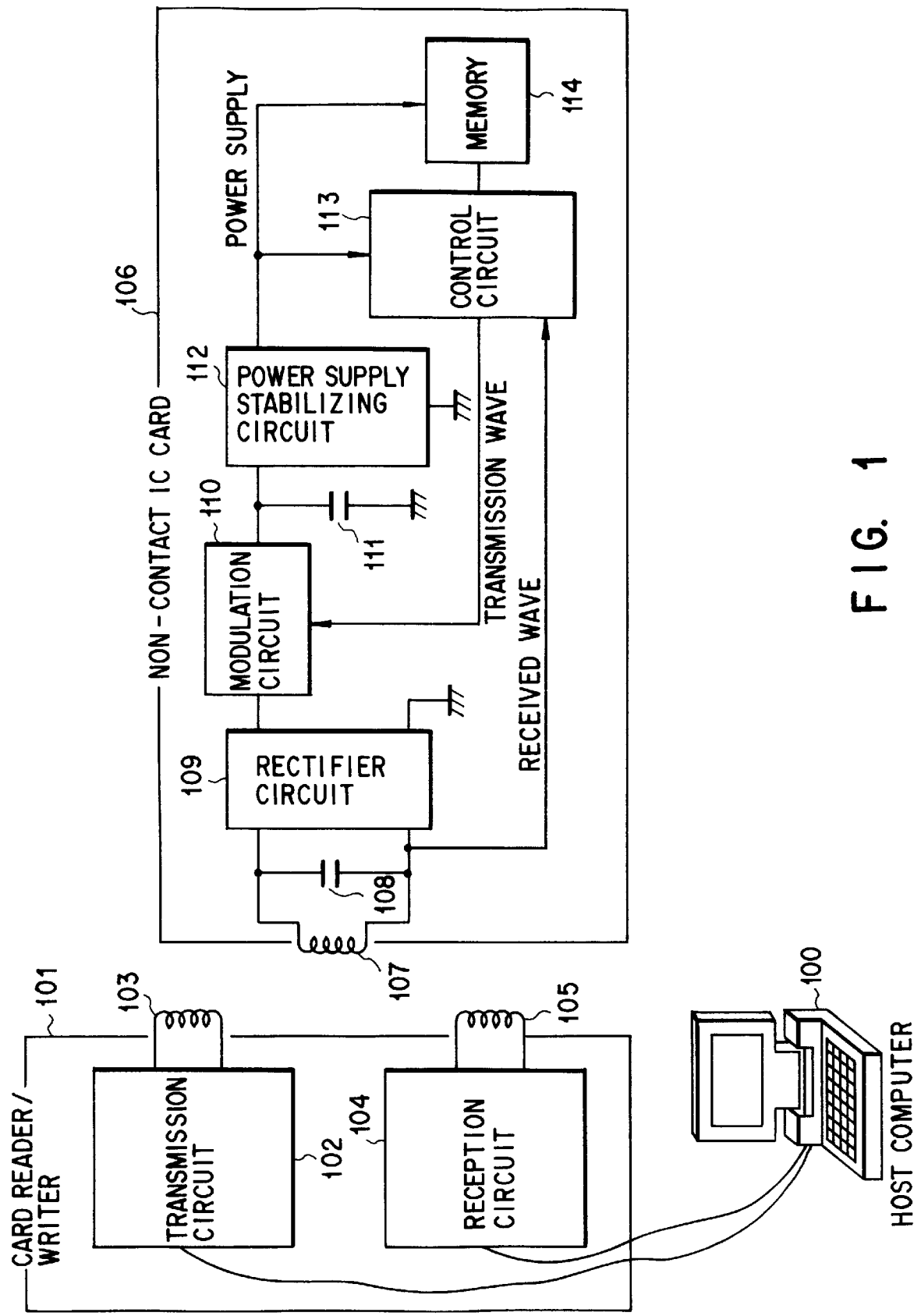
FIG. 1 is a block diagram, useful in explaining the subject matter of the invention.

FIG. 1 is a block diagram, showing a non-contact IC card system to which the invention is applied. This system is used to store or read information in or from a memory 114 incorporated in a non-contact IC card 106 in accordance with an instruction from a reader/writer 101.

In this system, the non-contact IC card 106 does not have a battery therein but receives power from a power transmission wave generated by the reader/writer 101. Thus, the card 106 is operated by the reader/writer operate in a non-contact manner. The present invention is directed to an improvement in data transmission means incorporated in the system for transmitting data from the non-contact IC card to the reader/writer.

FIG. 1 is a schematic view, showing an information processing system in which radio communication is performed between the reader/writer 101 as the information processing unit and the non-contact information storage medium 106 such as a non-battery type radio card. The present invention is directed, in particular, to an improvement in the non-contact information storage medium 106 incorporated in the system.

First, the schematic structure of the reader/writer 101 will be described with reference to FIG. 1. The reader/writer 101 has a transmission circuit 102 and a reception circuit 104, which are controlled by a host computer 100.

The transmission circuit 102 and the reception circuit 104 are connected to a transmission antenna coil 103 and a reception antenna coil 105, respectively. This enables transmission of power and data to the non-contact information storage medium 106, and reception of data from the medium.

On the other hand, the non-contact information storage medium 106 receives data and power through a transmission/reception antenna coil 107. The received power is converted into a stable DC current by means of a rectifier circuit 109, a capacitor 111 and a power smoothing circuit 112, and supplied to a control circuit 113, a memory 114, etc. incorporated in the non-contact information storage medium 106.

A wave received by the transmission/reception antenna coil 107 and including data is input via a capacitor 108. Then, the control circuit 113 subjects the received wave to a predetermined demodulation processing, and stores, in the memory 114, data extracted from the wave as a result of demodulation.

The control circuit 113 also reads data stored in the memory 114, subjects the data to predetermined processing, and supplies a modulation circuit 110 with the processing result as a transmission wave.

The present invention aims to provide a non-contact information storage medium capable of efficient data transmission and a data transmission method for the medium. To this aim, on the non-contact information storage medium 106 side, the output current of the rectifier circuit 109 is periodically reduced or interrupted, which serves as power supply means for supplying the internal circuit of the medium with a wave received by the transmission/reception antenna coil 107 and functioning as power for driving the circuit. This prevents the increase of a loss in the power obtained through the transmission/reception antenna coil 107, or a change in the resonant frequency of the antenna coil 107. As a result, the reduction of the power which can be used in the non-contact information storage medium 106, or the reduction of the distance through which data can be transmitted is prevented.

The embodiments of the invention with the above-described basic structure will be described in detail.

Figure 2:
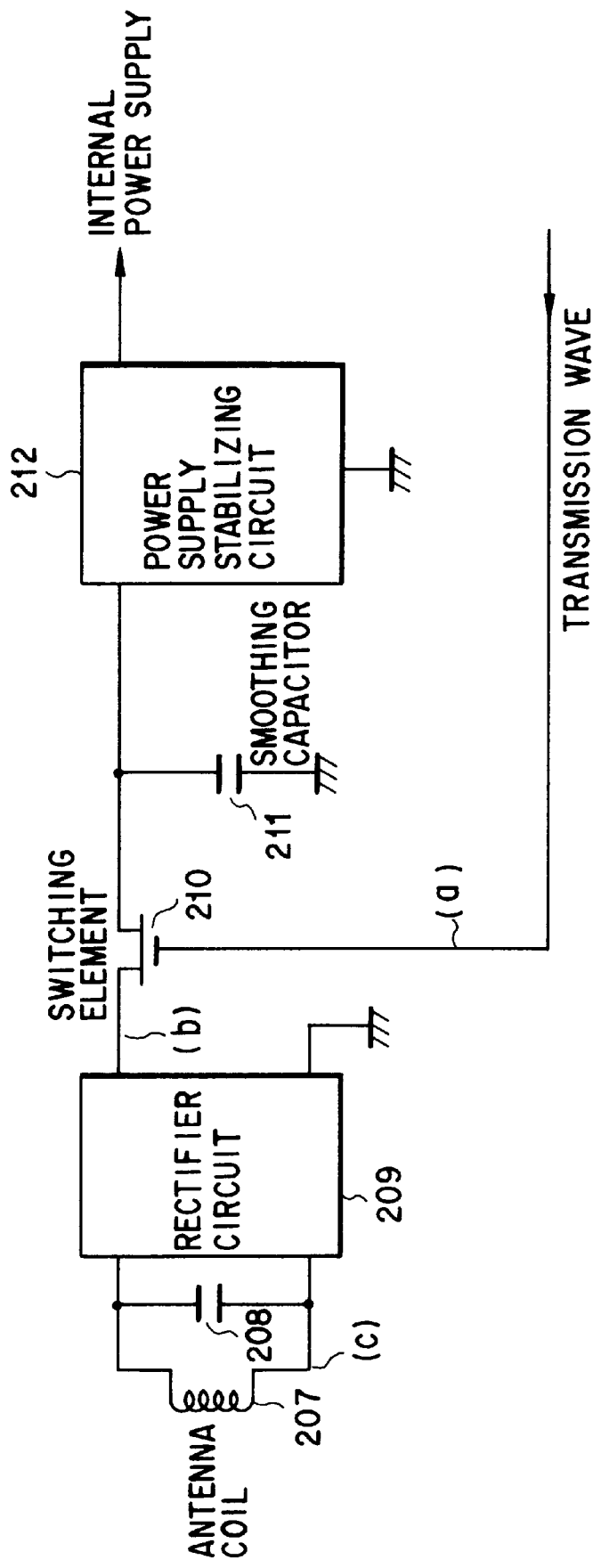
FIG. 2 is a block diagram, showing an essential part of a first embodiment of the invention.

FIG. 2 shows an essential part of the non-contact information storage medium 106 of FIG. 1, and more specifically, a basic structure for transmitting data from the medium 106 side. FIGS. 3A–3C show the waveforms of signals generated from elements in FIG. 2.

The output (b) (see FIG. 3B) of a rectifier circuit 209 is connected to and disconnected from a smoothing capacitor 211 side circuit by means of a switching element 210, which is controlled by transmission data from the control circuit 113. As a result, a current (c) (see FIG. 3C) occurring at an antenna coil 207 is controlled by a transmission wave (a) (see FIG. 3A) from the control circuit 113.

The transmission wave corresponds to transmission data modulated with a carrier wave which is used for radio transmission and has a predetermined frequency, and corresponds to data read from the memory 114. The frequency of the transmission wave will be described, taking, as an example, a frequency half the frequency of a radio wave from which power for driving the internal circuit is obtained (see FIG. 3A). The carrier wave is formed by dividing the radio wave into two portions by means of the control circuit 113.

The switching element 210 in FIG. 2, which corresponds to the modulation circuit 107 in FIG. 1, is switched between a state in which the output current (i.e. the load current) of the rectifier circuit 209 is supplied to the smoothing capacitor side, and a state in which the supply of the output current is stopped.

FIGS. 3A–3C show signal waveforms occurring when the switching operation is performed. As is shown in FIG. 3C, the current (c) of the antenna coil 207 contains the transmission wave (a). In other words, when the transmission wave (a) is at high level, the antenna coil current (c) has a large amplitude. The reader/writer 101 detects changes in the antenna coil current (c), thereby receiving data from the IC card.

On the basis of data from the control circuit 113, the switching element 210 as the modulation circuit 110 subjects the carrier wave to phase modulation, amplitude modulation (for example, the signal amplitude is set to a predetermined value or zero), frequency modulation, etc., thereby transmitting data.

Since the output of the rectifier circuit 209 is interrupted by the transmission wave (a) while the switching element 210 is in the non-conductive state, it appears that the efficiency of power extraction is extremely low in the non-conductive state. However, the antenna coil 207 and the capacitor 208 constitute a resonance circuit which resonates with the radio wave from which the power for the internal circuit is obtained. Therefore, a greater portion of the current is accumulated as a circulating current in the resonance circuit while the output of the rectifier circuit 209 is interrupted.

When the switching element 210 is returned to the conductive state by means of the transmission wave (a), a greater portion of the accumulated current is stored in the smoothing capacitor 211.

In the case of the conventional non-contact information storage medium, the rectifier output (b) is formed when the output of the rectifier circuit 209 flows to the earth via a resistor with a relatively low resistance, depending upon the contents of the transmission data. As a result, the antenna current is varied, thereby transmitting data. This being so, a loss in current is high at the time of data transmission.

On the other hand, in the present invention, the loss in the output of the rectifier circuit 209 mainly includes a loss occurring in the resonance circuit of the antenna coil 207 and the capacitor 208, and little loss due to a resistor as above required in principle at the time of modulation.

Accordingly, the data transmission method for the non-contact information storage medium of the invention is characterized in that a reduction in power is extremely small when the transmission wave (a) is generated.

When the data transmission method for the non-contact information storage medium of the invention is actually used, if the distance between the IC card as the storage medium 106 and the reader/writer is short, there is a case where the power generated from the antenna coil 207 is extremely large, and an excessive voltage is applied to the rectifier circuit 209 when, in particular, the output of the circuit 209 is interrupted. This makes it difficult to provide the rectifier circuit in a semiconductor integrated circuit with a low breakdown voltage.

Figure 4:
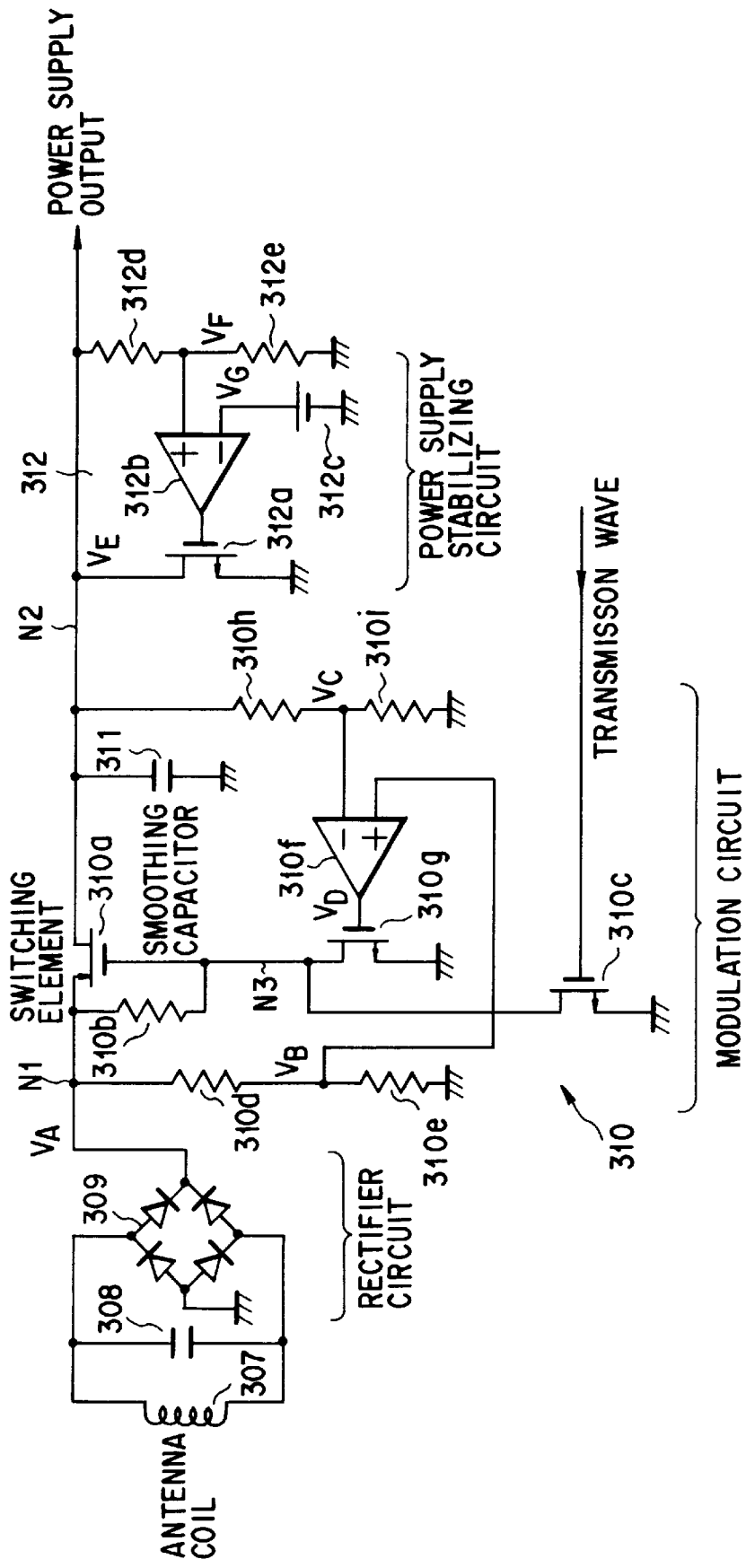
FIG. 4 is a circuit diagram, showing an essential part of a second embodiment of the invention.

FIG. 4 shows an IC card according to a second embodiment, which has a structure for preventing application of an excessive voltage as above to a rectifier circuit 309. The output of the rectifier circuit 309 is compared with a reference voltage (described later) by a comparator 310f, and is made to flow to the earth via resistors 310b and a transistor 310g when it nearly exceeds the breakdown voltage of each internal element of the circuit 309.

An antenna coil 307 and a capacitor 308 are connected parallel and constitute a parallel resonance circuit, which is connected to the rectifier circuit 309. The rectifier circuit 309 performs full-wave rectification of an AC voltage generated from the resonance circuit. The output terminal of the rectifier circuit 309 is connected to a node N1, which is connected to resistors 310d and 310b and also to the source of a p-channel MOS transistor (hereinafter simply called a "p-channel transistor") 310a. The resistor 310d is connected to a resistor 310e in series, thereby forming a voltage divider circuit. A junction therebetween provides a comparative voltage VB.

The source and gate of the p-channel transistor 310a are connected to each other via a resistor 310b. The drain of the transistor 310a is connected to a node N2. The node N2 is connected to a smoothing capacitor 311, a resistor 310h, the drain of an n-channel MOS transistor (hereinafter simply called a "n-channel transistor") 312a, and a resistor 312, for supplying them with a power supply output.

The gate of the p-channel transistor 310a is connected to a node N3, which is connected to the drains of n-channel transistors 310g and 310c. The sources of the n-channel transistors 310g and 310c are both grounded. The gate of the n-channel transistor 310c is supplied with a transmission wave from the control circuit 113.

Resistors 312d and 312e are connected in series, thereby forming a voltage divider circuit. A junction therebetween is connected to a non-inversion input terminal of a comparator 312b. The inversion input terminal of the comparator 312b is connected to the plus side of a reference voltage generating element 312c. The output of the comparator 312b is connected to the gate of the n-channel transistor 312a, and the source of the n-channel transistor 312a is grounded. The transistors 312a–312e constitute a voltage stabilizing circuit 312. The output voltage VE of the voltage stabilizing circuit 312, i.e. the charge voltage of the smoothing capacitor 311, is kept constant.

The resistor 310h and a resistor 310i are connected in series, thereby forming a voltage divider circuit. A junction therebetween provides a reference voltage VC. The reference voltage VC is applied to the inversion input terminal of a comparator 310f, while the comparative voltage VB generated from the divider circuit consisting of the resistors 310d and 310e is applied to the non-inversion input terminal of the comparator 310f. The output of the comparator 310f is connected to the gate of the n-channel transistor 310g.

In the above-described structure, the p-channel transistor 310a, the resistor 310b and the n-channel transistor 310c constitute a switching circuit, and the resistors 310d and 310e, the n-channel transistor 310g, the comparator 310f and the resistors 310h and 310i constitute a voltage limiting circuit. The switching circuit (310a–310c) and the voltage limiting circuit (310d–310i) constitute a modulation circuit 310.

The operation of the circuit shown in FIG. 4 will now be described in detail.

The voltage generated at the antenna coil 207 is rectified by the rectifier circuit 309. The resistor 310b is an element for applying a bias voltage to the p-channel transistor 310a, and the n-channel transistor 310c is an element for introducing a signal for switching on and off the p-channel transistor 310a in a cycle corresponding to that of the transmission wave under the control of the control circuit 113. Thus, the p-channel transistor 310a is controlled by the transmission wave from the control circuit 113.

The rectified wave of the rectifier circuit 309 is accumulated in the smoothing capacitor 311 via the p-channel transistor 310a when the transistor 310a is in the conductive state. Further, while the transistor 310a is in the conductive state, the output voltage of the rectifier circuit 309 substantially depends upon the charge voltage of the smoothing capacitor 311. The charge voltage of the smoothing capacitor 311 is controlled at a constant value by the voltage stabilizing circuit 312.

Specifically, the resistors 312d and 312e and the reference voltage element 312c of the voltage stabilizing circuit 312 apply a comparative voltage VF and a reference voltage VG to the comparator 312b, respectively. When the comparative voltage VF is lower than the reference voltage VG, the output of the comparator 312b is at low level, the n-channel transistor 312a is in the off-state, and the voltage VE at the node N2 is at high level. When, on the other hand, the comparative voltage VF is higher than the reference voltage VG, the output of the comparator 312b is at high level, the n-channel transistor 312a is in the on-state and the voltage VE at the node N2 is at low level. Thus, the voltage stabilizing circuit 312 keeps the voltage VE at the node N2 constant.

While the p-channel transistor 310a is in the non-conductive state, no load is applied to the rectifier circuit 309 and hence the output voltage VA of the circuit 309 increases. At this time, the comparator 310f compares the voltage VB obtained by dividing the output voltage of the circuit 309 by the resistors 310d and 310e, with the voltage VC obtained by dividing the charge voltage of the smoothing capacitor 311 by the resistors 310h and 310i. When the voltage VB is higher than the voltage VC, the output voltage VD of the comparator 310f is at high level. Accordingly, the n-channel transistor 310g is in the on-state, which means that the p-channel transistor 310a is in the conductive state and the output voltage VA of the rectifier circuit 309 is at low level.

On the other hand, when the voltage VB is higher than the voltage VC, the output voltage VD of the comparator 310f is at low level. Accordingly, the n-channel transistor 310g is in the off-state, which means that the p-channel transistor 310a is in the non-conductive state and the output voltage VA of the rectifier circuit 309 is at high level. Thus, the transistor 310g repeatedly turns on and off, thereby controlling the output voltage VA of the rectifier circuit 309 within a predetermined range.

The p-channel transistor 310a as the switching element is set in the non-conductive state in a cycle corresponding to that of the transmission wave. The maximum value of the output voltage VA of the rectifier circuit 309 can be set at an optimal value by adjusting the resistance ratio of the resistor 310d to the resistor 310e of one divider circuit and that of the resistor 310h to the resistor 310i of the other divider circuit.

Figure 5:
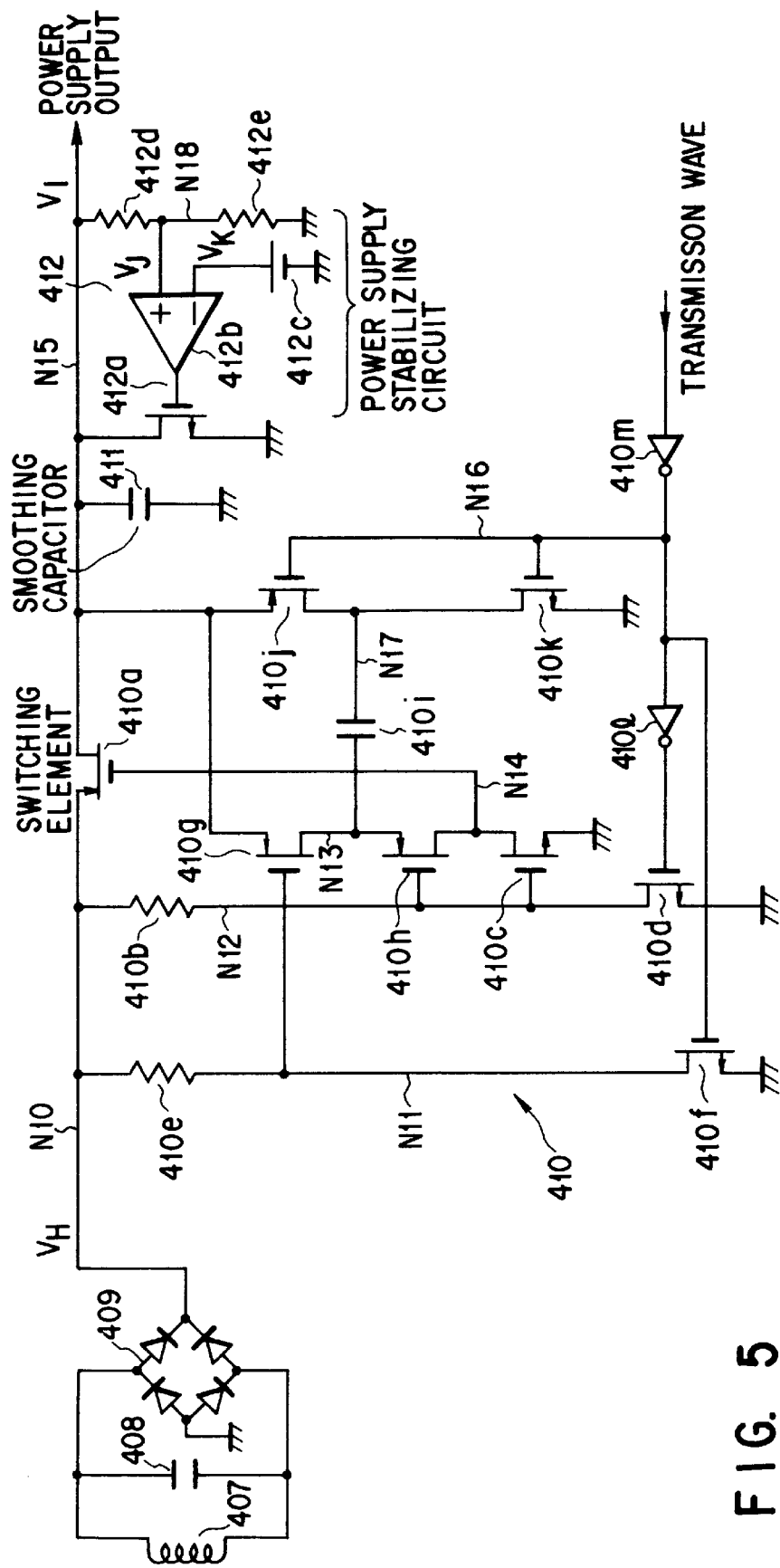
FIG. 5 is a circuit diagram, showing an essential part of a third embodiment of the invention.

FIG. 5 shows the circuit structure of a third embodiment of the invention. In this circuit, the power supply voltage smoothed by a smoothing capacitor 411 is accumulated in another capacitor 410i. The voltage accumulated in the capacitor 410i is added to the smoothed power supply voltage when the output current of the rectifier circuit 409 is interrupted, thereby generating a voltage for driving the switching element 410a. This circuit is constructed such that the voltage for driving the switching element 410a will not exceed a value twice the smoothed power supply voltage, thereby preventing the output voltage of the rectifier circuit 409 from exceeding a predetermined value.

An antenna coil 407 and a capacitor 408 are connected parallel to each other and constitute a parallel resonance circuit. This parallel resonance circuit is connected to the rectifier circuit 409 for performing full-wave rectification of the AC voltage generated in the resonance circuit. The output terminal of the rectifier circuit 409 is connected to a node N10, which is connected to resistors 410e, 410b and the source of a p-channel transistor 410a as a switching element. The other end of the resistor 410e is connected to a node N11, which is connected to the gate of a p-channel transistor 410d and the drain of an n-channel transistor 410f. The gate of the n-channel transistor 410f is supplied with a transmission wave via an inverter 410m, and the source thereof is grounded.

The other end of the resistor 410b is connected to a node N12, which is connected to the gate of an n-channel transistor 420c and the drain of an n-channel transistor 410d. The gate of the n-channel transistor 410d is supplied with the transmission wave via the inverter 410m and an inverter 410l, and the source thereof is grounded.

The drain of the p-channel transistor 410a serving as a switching element is connected to a node N15, which is connected to the sources of p-channel transistors 410g and 410j, the smoothing capacitor 411, the drain of an n-channel transistor 412a, and a resistor 412b, and provides the power supply voltage. Resistors 412d and 412e are connected in series, thereby forming a voltage divider circuit. A junction therebetween is connected to a non-inversion input terminal of a comparator 412b. The inversion input terminal of the comparator 412b is connected to the plus side of a reference voltage generating element 412c. The output of the comparator 412b is connected to the gate of the n-channel transistor 412a, and the source of the n-channel transistor 412a is grounded. The transistors 412a–412e constitute a voltage stabilizing circuit 412. The output voltage VI of the voltage stabilizing circuit 412, i.e. the charge voltage of the smoothing capacitor 411, is kept constant.

The gate of the p-channel transistor 410j is connected to a node N16, which is connected to the gate of the n-channel transistor 410k, the output terminal of the inverter 410m, the input terminal of the inverter 410l, and the gate of the n-channel transistor 410f. The drain of the p-channel transistor 410j is connected to a node N17, which is connected to the drain of the n-channel transistor 410k and one of the terminals of the capacitor 410i. The source of the n-channel transistor 410k is grounded.

The other terminal of the capacitor 410i is connected to a node N13, which is connected to the drain of the p-channel transistor 410g and the source of the p-channel transistor 410h. The drain of the p-channel transistor 410h is connected to a node N14, which is connected to the drain of the n-channel transistor 410c and the gate of the p-channel transistor 410a. The source of the n-channel transistor 410c is grounded.

In the structure of FIG. 5, the p-channel transistor 410a, the resistor 410b, the n-channel transistors 410c and 410d constitute a switching circuit, while the resistor 410e, the n-channel transistor 410f, the p-channel transistors 410g and 410h, the capacitor 410i, the p-channel transistor 410j, the n-channel transistor 410k and the inverters 410l and 410m constitute a voltage limiting circuit. The switching circuit (410a–410d) and the voltage limiting circuit (410e–410m) constitute a modulation circuit 410.

The operation of the circuit shown in FIG. 5 will now be described.

First, the voltage generated at the antenna coil 407 is rectified by the rectifier circuit 409. The voltage rectified by the rectifier circuit 409 is accumulated in the smoothing capacitor 411 via the p-channel transistor 410a when the transistor 410a is in the conductive state. Further, while p-channel transistor 410a is in the conductive state, the output voltage of the rectifier circuit 409 substantially depends upon the charge voltage of the smoothing capacitor 411. The charge VI of the smoothing capacitor 411 is controlled at a constant value by the voltage stabilizing circuit 412.

Specifically, the resistors 412d and 412e and the reference voltage element 412c of the voltage stabilizing circuit 412 apply a comparative voltage VJ and a reference voltage VK to the comparator 412b, respectively. When the comparative voltage VJ is lower than the reference voltage VK, the output of the comparator 412b is at low level, the n-channel transistor 412a is in the off-state, and the voltage VI at the node N15 is at high level. When, on the other hand, the comparative voltage VJ is higher than the reference voltage VK, the output of the comparator 412b is at high level, the n-channel transistor 412a is in the on-state and the voltage VI at the node N15 is at low level. Thus, the voltage stabilizing circuit 412 keeps the voltage VI at the node N15 constant. The p-channel transistor 410a is controlled by a transmission wave transmitted from the control circuit 113 (see FIG. 1) via the inverters 410m and 410t, and the transistors 410d and 410c. Specifically, when the transmission wave from the control circuit 113 is at low level, the n-channel transistor 410d is in the off-state, the n-channel transistor 410c in the on-state, the p-channel transistor 410a in the on-state, the p-channel transistor 410h in the off-state, the n-channel transistor 410k in the on-state, the p-channel transistor 410j in the off-state, the n-channel transistor 410f in the on-state, and the p-channel transistor 410g in the on-state. Thus, when the transmission wave is at low level, the p-channel transistor 410a is in the conductive state and the rectified output of the rectifier circuit 409 is accumulated in the smoothing capacitor 411 and the capacitor 410i.

On the other hand, when the transmission wave from the control circuit 113 is at high level, the n-channel transistor 410d is in the on-state, the n-channel transistor 410c in the off-state, the p-channel transistor 410a in the off-state, the p-channel transistor 410h in the on-state, the n-channel transistor 410k in the off-state, the p-channel transistor 410j in the on-state, the n-channel transistor 410f in the off-state, and the p-channel transistor 410g in the off-state.

Thus, when the transmission wave is at high level, the p-channel transistor 410a is in the non-conductive state. Since there is no load on the rectifier circuit 409 in the non-conductive state, its output, voltage VH is kept at high level. At this time, a voltage obtained by adding the charge voltage of the capacitor 410i to the charge voltage VI of the smoothing capacitor 411 is applied to the gate of the p-channel transistor 410a via the p-channel transistor 410h. In other words, a voltage substantially equal to twice the voltage VI is applied to the gate of the p-channel transistor 410a.

As described above, during the time when the p-channel transistor 410a is kept in the non-conductive state by the transmission wave from the control circuit 113, an increase in the output voltage VH of the rectifier circuit 409 can be optimally controlled by setting the gate voltage of the p-channel transistor 410a at a value substantially twice the charge voltage of the smoothing capacitor 411. In other words, when the p-channel transistor 410a is in the non-conductive state, the output voltage VH of the rectifier circuit 409 is kept at a voltage obtained by adding the threshold voltage of the p-channel transistor 410a to the voltage (2×VI).

In summary, the present invention provides a non-contact information storage medium capable of data transmission with only a small loss in the power obtained from an electromagnetic wave applied thereto from the outside, and a data transmission method employed therein.

Moreover, the present invention provides a cheap non-contact information storage medium with a circuit which is designed to limit the voltage input through its antenna and hence is constituted of elements with low breakdown voltages, and also a data transmission method employed therein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A non-contact information storage medium for receiving power from a received radio wave from outside of the medium, and transmitting data in a form of a transmission wave to the outside, comprising:

an antenna for obtaining power from a received radio wave;

a rectifier circuit for converting the power obtained by the antenna into a power current for powering a circuit incorporated in the medium;

a switching circuit connected to an output of the rectifier circuit for switching on and off a current path from the rectifier circuit in accordance with the transmission wave;

a smoothing capacitor connected to the output of the rectifier circuit through the switching circuit for accumulating the output current of the rectifier circuit and smoothing an output voltage; and a voltage stabilizing circuit connected to the smoothing capacitor for keeping at a constant value a charge voltage of the smoothing capacitor.

2. The medium according to claim 1, further comprising a voltage limiting circuit for limiting an output voltage of the rectifier circuit to a value less than a predetermined value when the current path from the rectifier circuit is switched off by the switching circuit.

3. The medium according to claim 2, wherein the voltage limiting circuit includes:

an n-channel transistor having a drain connected to the gate of the p-channel transistor, and a grounded source, and a gate;

a first voltage divider circuit for dividing the charge voltage of the smoothing capacitor to provide a first divided voltage;

a second voltage divider circuit for dividing the output voltage of the rectifier circuit to provide a second divided voltage; and a comparator having an input for receiving the first divided voltage, another input for receiving the second divided voltage, and an output connected to the gate of the n-channel transistor.

4. The medium according to claim 2, wherein the voltage limiting circuit includes a control voltage generating circuit for generating a control voltage corresponding to the predetermined value, and a voltage control circuit for controlling the output voltage of the rectifier circuit using the control voltage.

5. The medium according to claim 2, wherein the voltage limiting circuit includes a control voltage generating circuit for generating a control voltage corresponding to the predetermined value, and a voltage control circuit for controlling the output voltage of the rectifier circuit by supplying the control voltage to a gate of the MOS transistor.

6. The medium according to claim 5, wherein the switching circuit includes a p-channel MOS transistor having a source connected to an output of the rectifier circuit, a drain connected to the smoothing capacitor, and a gate, and the voltage control circuit controls the output voltage of the rectifier circuit by supplying the control voltage to the gate of the p-channel MOS transistor.

7. The medium according to claim 5, wherein the control voltage generating circuit includes a booster capacitor which is charged up to a charge voltage of the smoothing capacitor during the time when the rectifier circuit is connected to the smoothing capacitor via the switching circuit, and generates, when the rectifier circuit is disconnected from the smoothing capacitor, a voltage substantially twice the charge voltage of the smoothing capacitor by adding to the charge voltage of the smoothing capacitor a charge voltage applied to the booster capacitor during the time when the rectifier circuit is connected to the smoothing capacitor.

8. The medium according to claim 1, wherein the switching circuit includes:

a p-channel transistor having a source connected to an output of the rectifier circuit, a drain connected to the smoothing capacitor, and a gate connected to the source via a resistor; and a n-channel transistor having a drain connected to the gate of the p-channel transistor, a source grounded, and a gate for receiving the transmission wave.

9. The medium according to claim 1, wherein the voltage stabilizing circuit includes:

an n-channel transistor having a drain connected to the smoothing capacitor, a grounded source, and a gate;

a voltage divider circuit for dividing a charge voltage of the smoothing capacitor to provide a divided voltage;

a reference voltage generating circuit for generating a reference voltage; and a comparator having an input for receiving the divided voltage from the voltage divider circuit, another input for receiving the reference voltage from the reference voltage generating circuit, and an output connected to the gate of the n-channel transistor.

10. The medium according to claim 1, further comprising current control means for controlling, in accordance with a control voltage, a charging current flowing from the rectifier circuit to the smoothing capacitor, another capacitor for accumulating an electric charge of the smoothing capacitor, and means for adding a charge voltage of the another capacitor to the charge voltage of the smoothing capacitor when the output current of the rectifier circuit is interrupted to provide current control means with an addition result as the control voltage.

* * * * *